United States Patent
Fiocchi et al.

[11] Patent Number: 5,706,240
[45] Date of Patent: Jan. 6, 1998

[54] VOLTAGE REGULATOR FOR MEMORY DEVICE

[75] Inventors: Carlo Fiocchi, Belgioioso; Guido Torelli, S. Alessio, both of Italy

[73] Assignee: SGS-Thomson Microelectronics S.r.L., Agrate Brianza, Italy

[21] Appl. No.: 615,727

[22] Filed: Mar. 13, 1996

Related U.S. Application Data

[63] Continuation of Ser. No. 447,736, May 23, 1995, abandoned, which is a continuation of Ser. No. 83,377, Jun. 28, 1993, abandoned.

[30] Foreign Application Priority Data

Jun. 30, 1992 [EP] European Pat. Off. ............ 928303403

[51] Int. Cl.$^6$ ............................................. G05F 3/02
[52] U.S. Cl. ................... 365/226; 327/540; 327/541; 365/189.09
[58] Field of Search .................. 307/296.3, 296.6, 307/296.8, 310, 494; 365/189.09, 226; 327/512, 513, 540, 541, 544, 563, 307

[56] References Cited

U.S. PATENT DOCUMENTS

| | | | |
|---|---|---|---|
| 4,692,904 | 9/1987 | Sato et al. | 365/189.09 |
| 5,077,518 | 12/1991 | Han | 365/226 |
| 5,077,691 | 12/1991 | Haddad et al. | 365/218 |
| 5,083,043 | 1/1992 | Yoshida | 307/296.8 |
| 5,103,158 | 4/1992 | Cho et al. | 307/296.8 |
| 5,124,631 | 6/1992 | Terashima | 307/296.8 |
| 5,231,316 | 7/1993 | Thelen, Jr. | 307/310 |
| 5,281,906 | 1/1994 | Thelen, Jr. | 307/296.8 |
| 5,309,399 | 5/1994 | Murotani | 307/296.8 |
| 5,321,660 | 6/1994 | Sani et al. | 365/189.09 |

FOREIGN PATENT DOCUMENTS 62-188255  8/1987  Japan .................. 307/296.8

*Primary Examiner*—Terry Cunningham
*Attorney, Agent, or Firm*—David V. Carlson; Robert E. Mates; Seed and Berry LLP

[57] ABSTRACT

A voltage regulator for electrically programmable, non-volatile memory devices has an output terminal connected to a power supply line for programming the state of at least one memory element through at least one selection circuit. At least first and second resistive elements are connected between first and second terminals of a voltage supply. At least a first circuit is matched to the at least one selection circuit, and the first circuit is coupled serially with the resistive elements between the two terminals of the voltage supply. At least one control current generator is connected between one of the first and second voltage supply terminals and a node linking to one of the resistive elements, and the current of the controlled current generator is controlled to be a function of current through the at least one selection circuit. An operational amplifier has an inverting input and a non-inverting input, and the non-inverting input is connected to a node linking to at least one of the resistive elements. An output terminal of the operational amplifier is the regulator output terminal to which the inverting input is coupled.

28 Claims, 5 Drawing Sheets

VOLTAGE REGULATOR FOR MEMORY DEVICE

CROSS-REFERENCES TO RELATED APPLICATIONS

This application is a file wrapper continuation of U.S. patent application Ser. No. 08/447,736, filed May 23, 1995, now abandoned, which is a file wrapper continuation of U.S. patent application Ser. No. 08/083,377, filed Jun. 28, 1993, now abandoned.

TECHNICAL FIELD

This invention relates to monolithically integrated voltage regulators, and particularly to a voltage regulator for use in electrically programmable, non-volatile memory integrated circuits implemented in CMOS technology.

BACKGROUND OF THE INVENTION

A non-volatile memory cell consists of a MOS transistor wherein the gate electrode which overlies the channel region is a floating electrode (i.e., one having a high DC impedance toward all the other nodes of the cell and the external circuit in which the cell is connected). The cell further includes a second gate electrode, referred to as the control gate, which is driven by appropriate control voltages. The other electrodes of the transistor are standard drain, source, and body electrodes.

By the use of suitable techniques, the amount of charge present on the floating gate can be varied, and with it can be varied the threshold voltage as "seen" from the control gate (commonly referred to as the threshold voltage of the transistor for simplicity). This enables the transistor to enter either of two logic states, one at a "high" threshold voltage and one at a "low" threshold voltage. When there is applied to the control gate an intermediate voltage to the two threshold voltages, it becomes possible to "read out" the transistor state, because of the transistor either having a low or a high impedance across its drain and source electrodes contingent on the value of its threshold voltage. The transistor can be viewed, therefore, as a memory-type of logic element. Since the floating gate has a very high impedance toward any other node, its charged state can be retained over a fairly long time period, thereby the cell will exhibit "non-volatile memory" features; the logic state of the cell is, in fact, maintained for an indefinite time even if the power supply to the circuit in which it is connected is cut off.

The operation whereby charge is stored in the floating gate is defined as "programming", and the operation whereby the charge present in the floating gate is removed therefrom is called "clearing." For simplicity, the following description considers: a cell comprising an n-channel transistor; the charge stored in the floating gate composed of electrons; and, the cell threshold voltage brought to a high by the programming operation.

The problem underlying this invention relates to the cell programming operation. To carry out this operation, both the drain electrode and the control gate of the cell must be brought to adequate levels of positive voltage while holding the source electrode at the negative supply voltage, VSS, which can be assumed to be the same as the ground voltage, and to which the body electrode can also be assumed to be connected. This induces a positive voltage in the floating gate. By virtue of the voltage levels applied to its electrodes, the cell transistor is driven to work in the saturation range and traversed by a high current. This situation results, where suitable voltage levels are applied, in electrons passing through the silicon oxide that separates the channel region from the floating gate; the flow of electrons is directed to the latter, which then becomes charged negatively. The threshold voltage of the transistor changes during the programming operation, and accordingly, the intensity of the current flowing through it becomes variable over time. Where, with the transistor control gate being applied the required positive voltage for the programming operation, and no positive voltage being applied to its drain electrode, no current is flowed through the cell, and therefore, the latter is not programmed. Oftentimes, the cell programming is carried out by means of a set of short programming pulses rather than of a single pulse of longer duration ("pulsive programming").

An electrically programmable non-volatile memory circuit usually includes a very large number of cells. The cells are organized into rows and columns (bit lines). Cells in one bit line have their drain electrodes in common. Each cell is identified individually by activating a row line.

At the system level, there are two voltages which are supplied to the memory device from an external source, namely: a supply voltage $V_{DD}$ and a programming voltage $V_{PP}$. Typical ratings for these voltages are 5 V and 12 V, respectively (such values being referred to $V_{SS}$). Applicational specifications usually provide for a smaller percent variation tolerance for $V_{PP}$ than $V_{DD}$.

In order to program a given cell, the row line and bit line which identify it must be brought to suitable positive voltage levels. The bit line is usually brought to the proper level by activating two selection transistors MW and MB which are operatively connected in series with each other and to the memory cell. It is only when the selected cell is to be programmed that the two transistors are turned on simultaneously to enable the selected bit line to be brought to a high voltage. The two transistors may be complementary types, e.g., n-channel for MB and p-channel for MW.

Activation of the bit line is accomplished using two signals SelW and SelB which are applied to the gate terminals of both transistors MW and MB; MW will be on with SelW at a logic low, and MB will be on with SelB at a logic high. (It is obviously necessary that the voltage values attained by the signals at the two logic levels be appropriate.)

The programming of a memory cell is markedly affected by the voltage applied to the drain, that is by the voltage $V_{BL}$ present on its respective bit line. A low voltage value would result in inefficient and slow programming of the cell, whereas too high a value would bring about a phenomenon known as soft-erasing which consists of the cell becoming partly cleared. The optimum range for $V_{BL}$ is fairly narrow (typically within about 5 V to 6 V).

Thus, a highly accurate voltage regulator is required to provide the right voltage for the bit line during the programming step. As previously mentioned, during this step the cells being programmed draw a large amount of current, which is to be supplied through the regulator. In order to speed up the programming operation, the regulator ought to rapidly respond to the demand of memory cells for current, especially where the programming is performed using the pulsive technique.

One should note, however, that the requisite accuracy and ability to supply high currents with short response times may still be insufficient to ensure optimum performance under all programming conditions. In fact, because the bit line is selected through two transistors, where the value of the current $i_{BL}$ drawn by the bit line is relatively high (on the order of a few mAmps), the resistances of the selection transistors in the on state cause a voltage drop $v_{BL}$ which in turn causes the voltage $v_{BL}$ on the bit line to differ significantly from the output voltage VREG from the regulator. As a result, the system performance, in terms of cell programmability, deteriorates.

Prior art methods of-obviating this problem are known, for example, from the article "An In-System Reprogrammable 32 k×8 Cmos Flash Memory", *IEEE Journal of Solid-State Circuits*, Vol. SC-23, No. 5, October 1988.

Depicted in FIG. 1 of the drawings is a diagram of the circuit approach proposed in that article. The required current for programming is supplied to the bit line through a programming voltage line, $V_{PP}$. Between said programming voltage line and ground, a voltage regulator is provided Which comprises a voltage divider formed of three resistors R1, R2, R3, and four transistors M1, M2, M3 and M4 connected in parallel therewith and in series with one another via their source and drain terminals.

The gate terminals of the transistors M1, M4 and M3 are respectively connected to a node between resistors R1 and R2, a node between resistors R2 and R3, and the programming voltage line.

The voltage present on the bit line is equal to the voltage WREF present on the gate terminal of transistor M2, which is connected in a diode configuration, but for a negative level translation due to a transistor pair M6, M7 being traversed by a current during the programming operation. The transistors M6 and M7 constitute—in the configuration illustrated—the bit line selection transistor and write selection transistor, respectively.

The voltage V1 on the source of the p-channel transistor M4 is set by the resistive divider formed of R1, R2 and R3, and given by:

$$V1=VPP*[R1+R3/(R1+R2+R3)] \quad (1)$$

The divider is sized to have the voltage rating V1 equal to the required value on the bit line for the programming operation to be performed in an optimum manner under nominal conditions.

The actual voltage output from the regulator, WREF, is raised above the value V1 by means of a positive level translation, caused by the n-channel transistors M3 and M2. The two transistors M2 and M3 connected in the regulator's final stage (which stage comprises the transistors M1 through M4) are matched to transistors M6 and M7, respectively. The dimensions of transistor M1, functioning as a current source, are selected such that the current density through transistors M2 and M3 is the same as the ideal current required to flow through the two transistors M6 and M7 during the programming step. Thus, the voltage drop across WREF and the bit line will be equal to that present across the series formed of the transistors M2 and M3. Accordingly, if the current flowing through M6 and M7 during the programming step is the same as the ideal current to be used during the programming step, then the voltage on the bit line will be the target value V1.

However, that technique is not so effective and some drawbacks become noticeable. For example, the programming current drawn by the selected cell may vary between integrated circuits due to unavoidable variations in the manufacturing process. The integrated circuit may also undergo variations in response to changes in environmental and applicational conditions. Consequently, it would be arbitrary for a designer to define the value of the current flowing through the two transistors M6 and M7, and set the value of the current to be flowed through M2 and M3, from the drawing board. In actual practice, the designer can only fix the typical or ideal value of the current that should flow through the bit line during the programming step, and based on it, fix the current through transistor M1. However, if the current that actually traverses the bit line during the programming step differs from that flowing through the regulator output stage in accordance with this design option, then the voltage on the bit line will be incorrect.

Further, at the designing stage, the threshold voltage of the memory cell tends to become gradually higher, such that the cell current draw will decrease over time. A voltage regulation effected on an estimate of a mean value for the programming current cannot, therefore, yield satisfactory results each time.

SUMMARY OF THE INVENTION

It is an object of this invention to arrange for the output voltage from the regulator to be such that the voltage present at each time on the bit line during the programming step will actually be the same as the voltage required to implement the programming operation in an optimum manner.

This object is achieved by a voltage regulator as characterized in the appended claims.

The features and advantages of a regulator according to the invention can be more clearly understood from the following detailed description of some embodiments thereof, given by way of non-limitative examples with reference to the accompanying drawings.

DETAILED DESCRIPTION OF THE INVENTION

Figure 1:
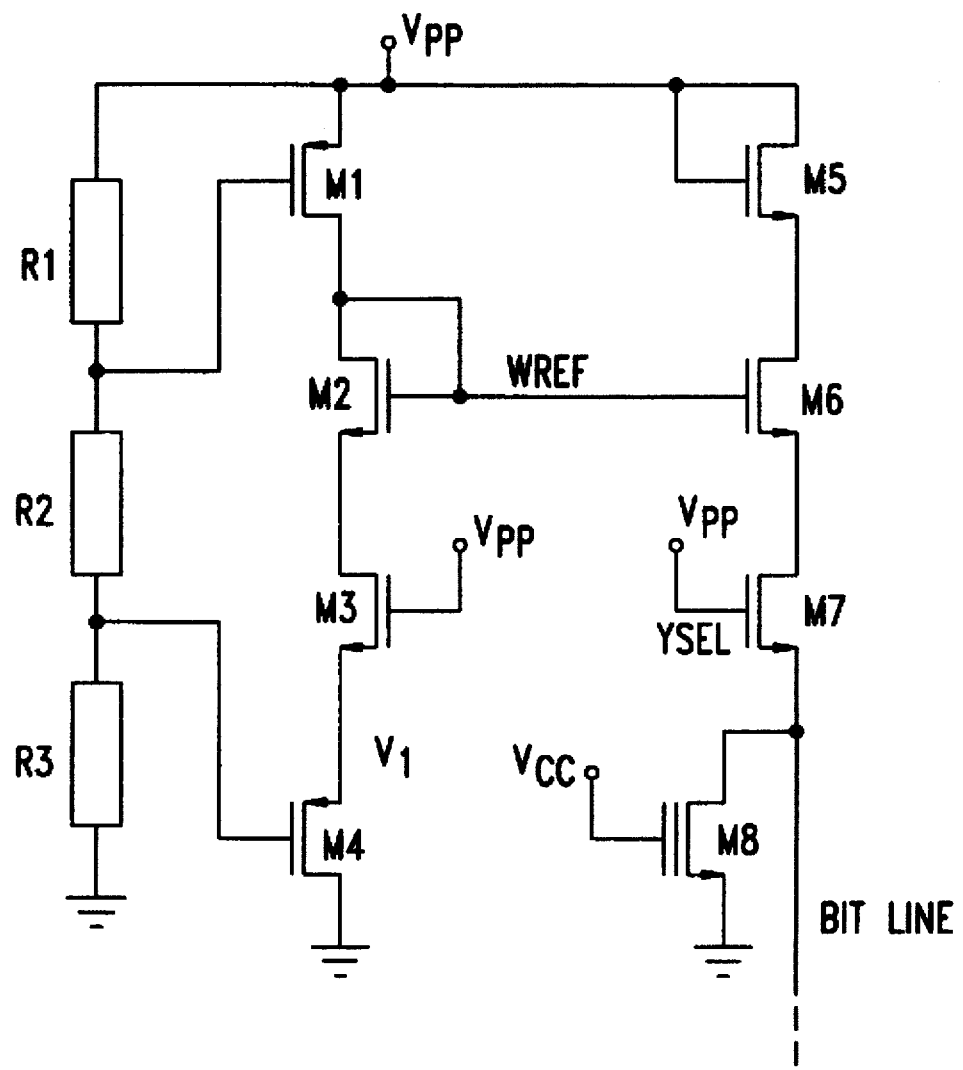
FIG. 1 is a diagram of a programming circuit incorporating a prior art voltage regulator.
Figure 2:
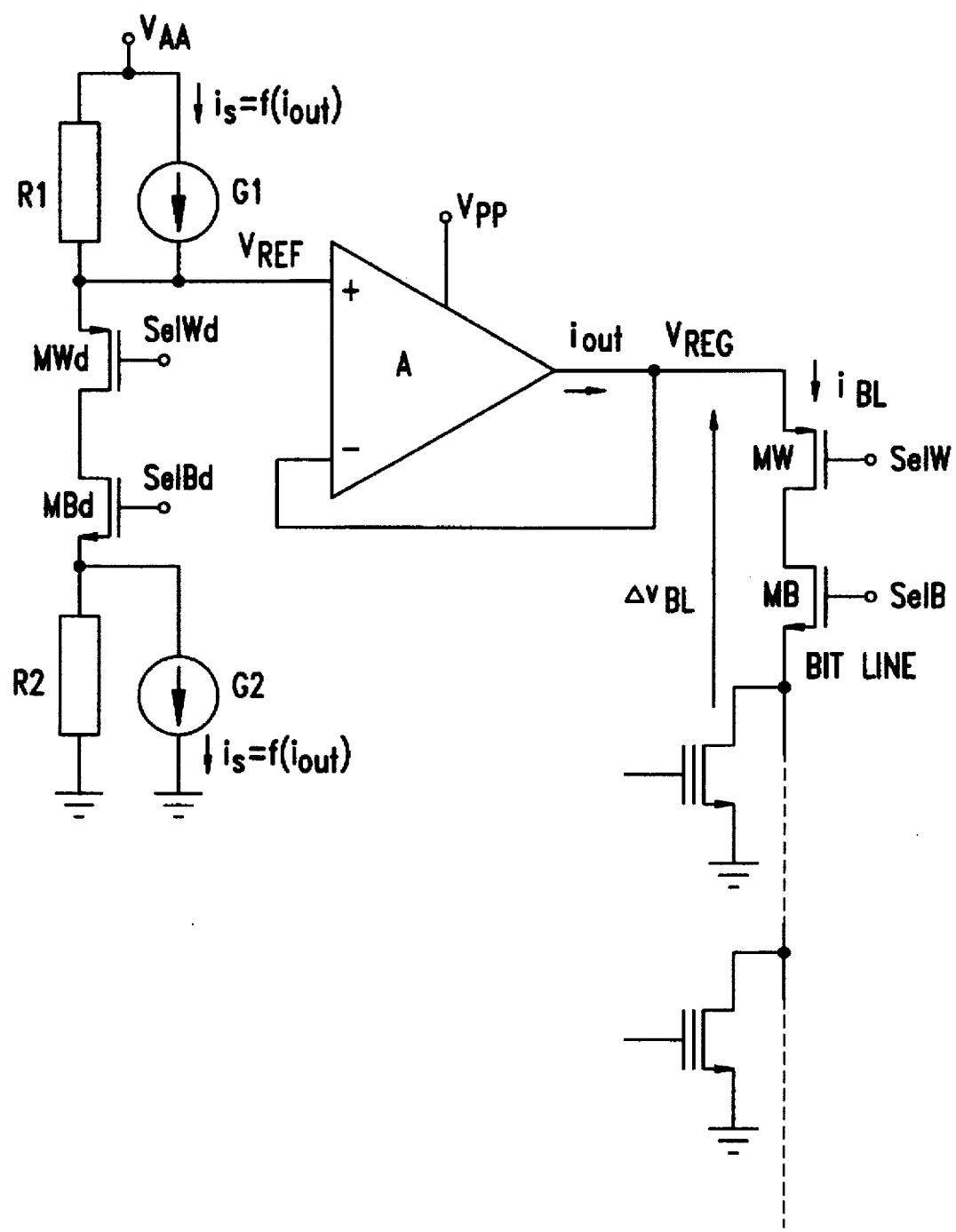
FIG. 2 is a general diagram, partly in block form, of a voltage regulator according to the invention, to which a programming circuit is linked.

The voltage regulator circuit arrangement according to the invention, as shown in FIG. 2, comprises an operational amplifier (A) connected in a unitary gain configuration and having a voltage $V_{REF}$ applied to its non-inverting input which is to be duplicated on the output for powering the load. The output voltage $V_{REG}$ from the regulator is ideally equal to $V_{REF}$. The voltage $V_{REF}$ applied to the non-inverting input of the amplifier is obtained through a divider formed of two resistors R1 and R2, between which resistors there are connected two transistors MWd and MBd, respectively, matched to the selection transistors MW and MB of the bit line (i.e., having the same characteristics as the latter transistors but for a suitable scaling factor in the ratio W/L of the actual channel width to the actual channel length, as explained hereinafter). The transistors MWd and MBd are not effective to carry out any selection, and could be referred to as dummy transistors.

Command signals SelWd and SelBd are applied to the gate terminals of such dummy transistors which may be typically coincident with the signals SelW and SelB, respectively, being applied to the selection transistors MW and MB. The circuit further includes controlled current generators, G1 and G2, which supply a current equal to the current $i_{BL}$ which is output from the regulator and drawn by the bit line. These generators may be implemented by current mirror circuits. In one embodiment, the operational amplifier includes a gain stage and a source-follower output stage.

A voltage $V_{AA}$ is a constant voltage source applied to the voltage divider, particularly, to resistor R1 and to current generator G1. A voltage $V_{PP}$ is a constant voltage source applied to the amplifier A. A voltage $V_{AA}$ preferably has a voltage value equal to or greater than the voltage $V_{PP}$.

The voltage $V_{REF}$ is:

$$V_{REF} = V_{PROG} + vd \quad (2)$$

where $V_{PROG} = V_{AA}*[(R2+Ron.d)/(R1+R2+Ron.d)]$, and $$vd = i_s Ron.d * R1/(R1+R2+Ron.d) = \beta i_s Ron.d \quad (3)$$

Ron.d is the sum of the resistances in the on state of the transistor pair MWd and MBd, thus, $$Ron.d = Ron.MWd + Ron.MBd \quad (4)$$

In the above relation, it has also been assumed that $$\beta = R1/(R1+R2+Ron.d) \quad (5)$$

By suitable selection of the scaling factor between the transistor pairs MWd, MBd and MW, MB., i.e., if:

$$(W/L)MWd/(W/L)MW = (W/L)MBd/(W/L)MB = R1/(R1+R2+Ron.d) = \beta \quad (6)$$

then Ron.d=(1/β)Ron.BL, where Ron.BL is the bit line resistance when a memory cell is being programmed (i.e., Ron.BL=Ron.MW+Ron.MB where Ron.MW and Ron.MB are the resistances of the transistors MW and MB, respectively, in the on state). Therefore, since $i_s = i_{BL}$, then:

$$v_s = v_{BL} \quad (7)$$

Thus, the voltage $v_{BL}$ on the bit line will be:

$$v_{BL} = V_{REG} - v_{BL} = V_{REF} - v_{BL} = V_{PROG} + vd - v_{BL} = V_{PROG}$$

The divider sizing is arranged to have the voltage $V_{PROG}$ equal to the required voltage on the bit line for optimum implementation of the cell programming.

Accordingly, the compensation for the voltage drop across the bit line selection transistors will be applied to the value of the current being instantaneously supplied to the load, rather than to the mean current value. The voltage on the bit line will, therefore, be at all times its ideal value ($V_{PROG}$) regardless of process variations and the resistance of the selection transistors in the on state (provided that a good matching is ensured between them and the dummy transistors). Conveniently, the voltage drop across the dummy transistors should in no case shift the voltage $V_{REF}$ applied to the non-inverting input terminal of the amplifier upwards enough for the latter voltage to depart from the range of values encompassed by the amplifier input dynamic range. The resistance of these transistors in the on state should not be too high, if excessively high time constants are to be avoided, because said resistance is in series with large capacitances. Within the regulator response time limits, the ideal voltage value on the bit line is held constant each time.

Understandably, the same results can be obtained by having the dummy transistors MWd and MBd identical with transistors MW and MB, and the current $i_s$ from the generators G1 and G2 made equal to $i_{BL}/\beta$. Additionally, although R1 and R2 are described above as resistors, any resistive element may be used, including diodes, transistors or other elements known by those skilled in the art.

The voltage supply $V_{AA}$ is shown as connected to the resistor R1, and the voltage supply $V_{PP}$ is shown connected to the operational amplifier A. In an alternative embodiment, only a single voltage supply $V_{PP}$ is used, connected to both the amplifier A and the resistor R1. In either embodiment, $V_{AA}$ is a constant voltage source of a value equal to or greater than $V_{PP}$.

Alternatively, a circuit could be provided wherein the current $i_s$ is decreased by a factor μ from $i_{BL}$ such that $i_s = i_{BL}/\mu$ and the factor W/L for the dummy transistors is divided through that same factor under relation (6) above. Thus, Ron.d=(μ/β)Ron.BL, and relation (7) is still valid. This affords a reduction in the occupied area and the structure's power dissipation (especially during the transition phase).

The programming of a memory device usually takes place in parallel on all the cells of one word. Understandably, only those cells are programmed for which an increase in the value of the threshold voltage is envisaged, because corresponding data to a given logic level, 0 or 1, is to be stored therein according to the agreed correspondence between the logic value and the threshold voltage of the cell. The output current from the regulator should be equal to the combined currents drawn by the cells actually being programmed. In order to provide proper compensation for the voltage drop appearing across the selection transistors of the selected bit lines, the current density through the dummy transistors should be equal to that through the bit line selection transistors. This can be accomplished by connecting in the divider a number of parallel-connected dummy transistor pairs MWd and MBd equal to the number of cells making up a word. During a programming operation, the same number of dummy pairs will be activated as the number of the cells actually to be programmed. This can be readily obtained with conventional techniques, such as by linking the gate electrodes of the dummy transistors in each pair to appropriate command signals. Reference will be made hereinafter to a single dummy transistor pair, it being understood that the discussion covers the provision of plural dummy transistor pairs to be activated to suit the data being programmed in the cells of the selected word.

Similar considerations would apply, of course, to multiprogramming techniques as well, whereby several n-bit words are programmed in parallel.

The diagram shown in FIG. 2 provides ideal matching of the selection transistors to their corresponding dummy transistors connected in the resistive divider, since they are both in the same bias conditions. For the corresponding dummy transistors, the threshold voltages VTH (including, where applicable, the contribution from "body effect") and the overdrive voltages (Vgs-VTH) are, in fact, the same.

With this structure, the same current $i_s$ should be injected into and picked up from the divider (across the series of the dummy transistors). This requires good matching between the current generators G1 and G2 and an increased area for the structure. Providing two matched generators, one of which supplies current and the other of which draws current, moreover, requires some power to be dissipated. In actual practice, once the current from one generator (e.g., G1) has been obtained, it is mirrored in a structure which fixes the current from the other generator (G2) through a further current mirror circuit.

Figure 3:
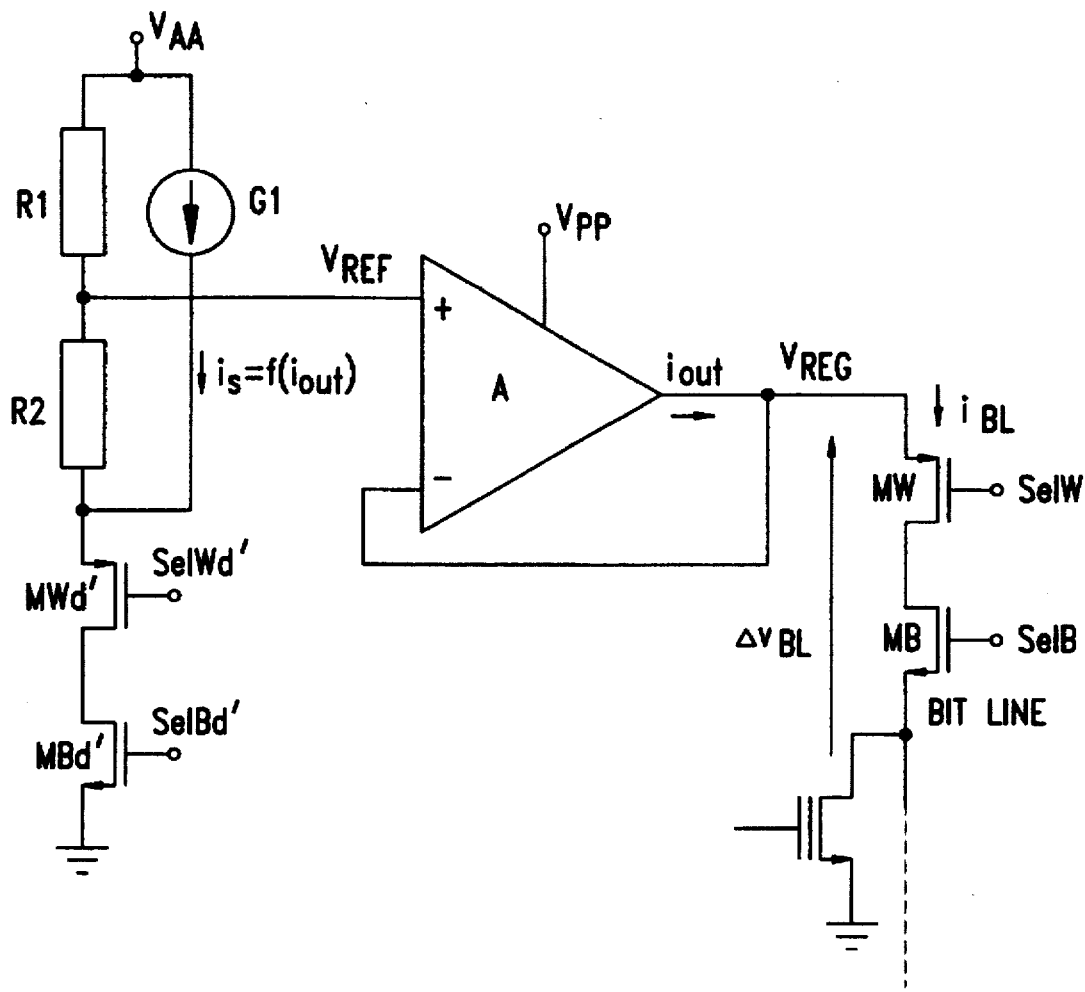
FIG. 3 shows a simpler circuit layout for a voltage regulator according to the present invention.

A simpler, albeit less accurate, solution consists of shifting the dummy switches to the low end of the resistive divider, as shown in FIG. 3. (The dummy transistors involved are MWd' and MBd', whose gate electrodes are driven by command signals SelWd' and SelBd', respectively.) In this alternative embodiment, it no longer becomes necessary to pick up current from the divider, thereby a single current generator $i_S$ will be adequate, with the advantage over the structure shown in FIG. 2 of having less area occupied and less power dissipation. This solution, while being qualitatively equivalent to the previous embodiment, requires greater design accuracy and some compromising, because the voltages appearing on the source and drain electrodes of transistors MW and MB, and respective dummy transistors, are no longer equal when the transistors are turned on. This can be compensated for to some extent by suitably varying the size (i.e., the value of the ratio W/L) of the dummy transistors from that of the corresponding selection transistors to which the dummy transistors are matched, and using appropriate voltage values for the command signals SelWd' and SelBd'.

Figure 4:
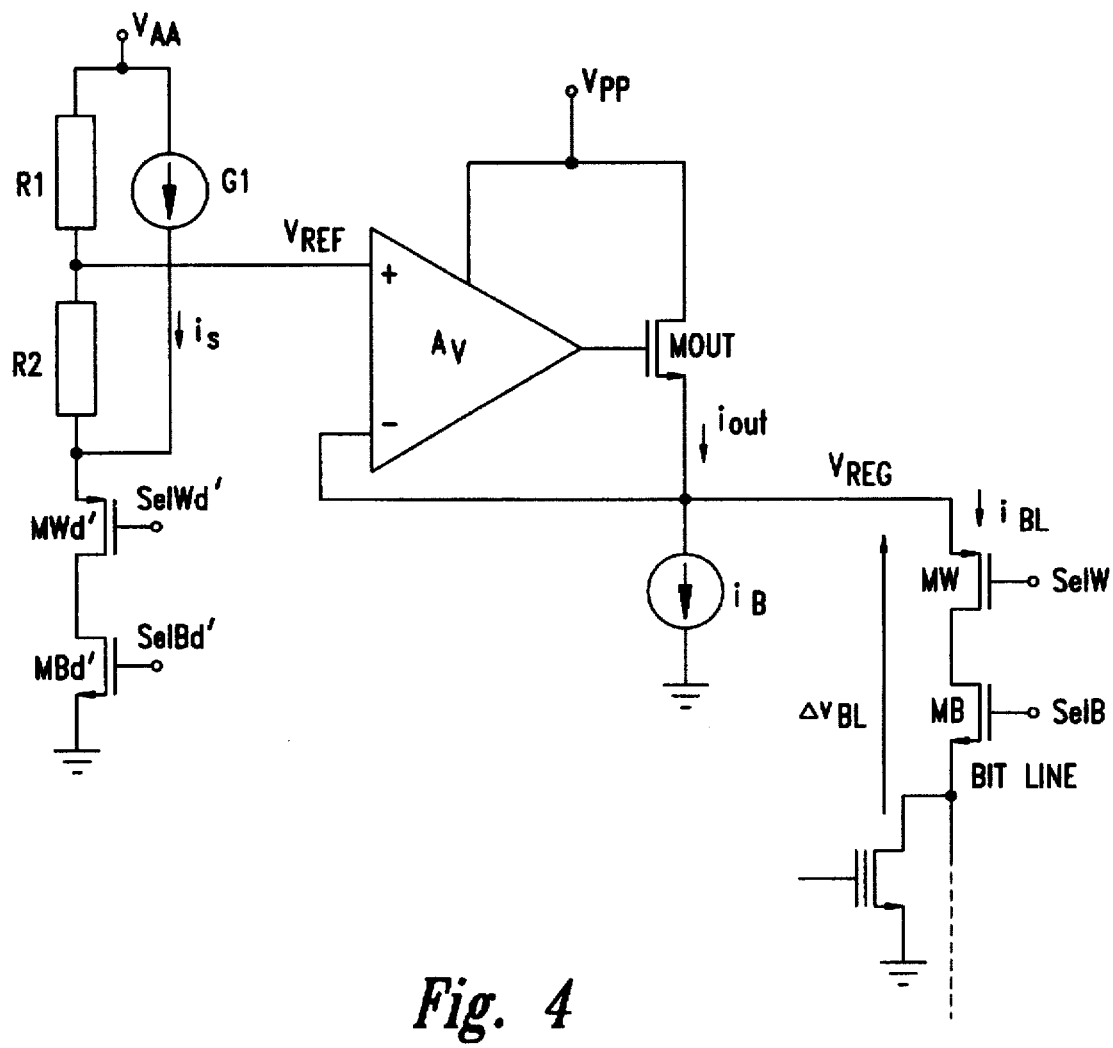
FIG. 4 shows an alternative embodiment for a voltage regulator according to the present invention.

Another circuit diagram for implementing the voltage regulator of this invention is shown in FIG. 4. The operational amplifier of this alternative embodiment consists of a gain stage $A_v$ having a source-follower stage, transistor MOUT biased by a constant current generator $I_B$, in cascade connection thereto. The current $i_{OUT}$ flowing through the transistor MOUT is equal to that being supplied each time to the load and through the bit line selection switches, plus the bias current $I_B$ of the output branch. The current $i_{OUT}$ is mirrored into the generator G1 and passed through the two dummy transistors MWd' and MBd', thereby compensating for the voltage drop $V_{BL}$, which will take place across the bit line selection transistors. Understandably, the contribution from the bias current $I_B$ to the current $i_S$ being injected into the two dummy transistors originates a contribution to the value of the voltage $V_{REF}$, which is substantially unrelated to the value of the current supplied by the regulator to the load. This contribution should be taken into account in sizing the divider if the value $V_{REF}$ is to be the target value.

Figure 5:
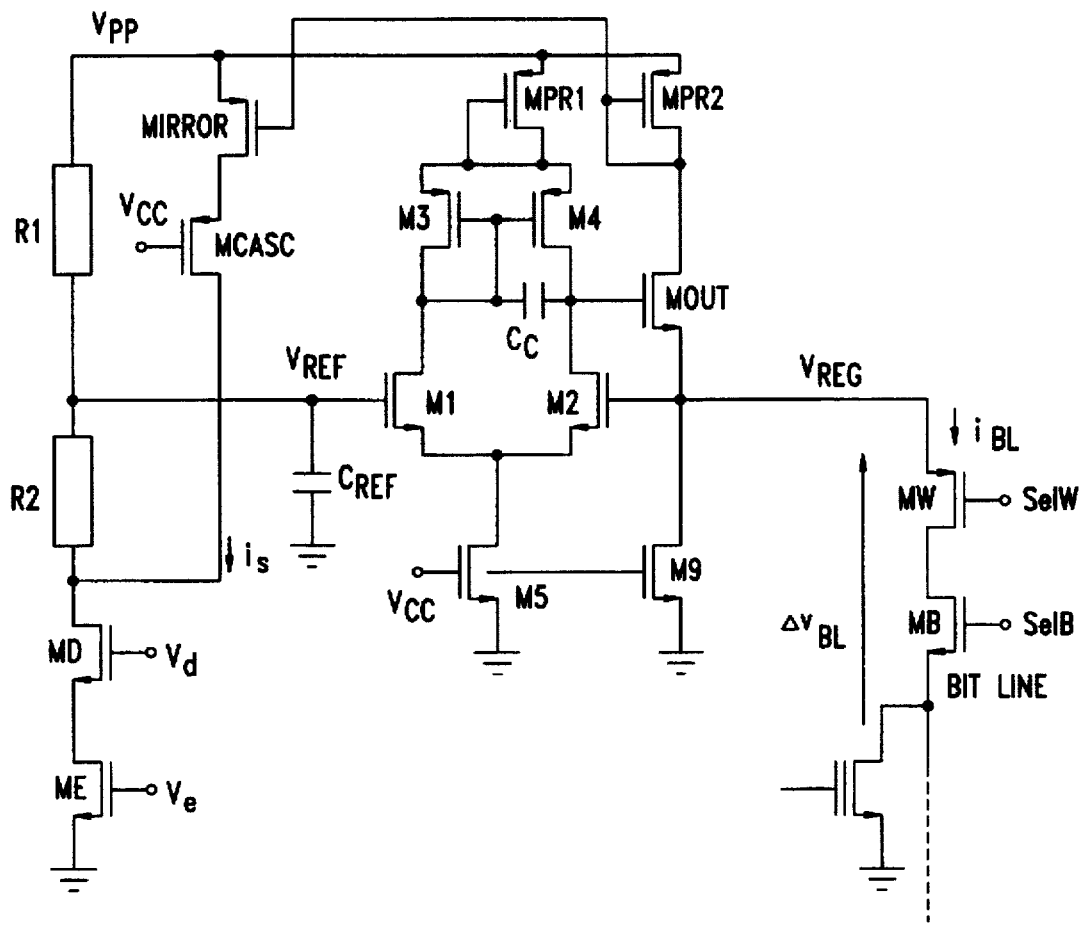
FIG. 5 illustrates an example of a complete circuit diagram implementing the voltage regulator shown in FIG. 4.

FIG. 5 shows a complete circuit diagram for a regulator implemented in accordance with the last-mentioned inventive technique (i.e., the circuit shown in FIG. 4).

The operational amplifier $A_v$ comprises transistors M1 through M5 and MPR1, and a capacitor $C_c$. The source-follower stage consists of the transistor MOUT connected serially to MPR2 and biased by the current generator provided through transistor M9.

The resistive divider is formed by the resistors R1 and R2 and the transistor pair MD and ME, into which the current $i_S$ is injected. The current is obtained by means of the current mirror formed by the transistors MPR2 and MIRROR. The transistor MPR1 improves the structure's reliability by preventing the appearance, on the source electrodes of transistors M3 and M4, of an excessively high voltage apt to degrade the transistor pair. The transistors MPR2 and MIRROR provide the required current mirror to inject a current into transistors MD and ME which is matched to that supplied to the load. The capacitor $C_{REF}$ is effective to improve the circuit's frequency stability.

The advantage of a voltage regulator according to the invention is that it can output a voltage whose value is changed each time to suit the current being supplied to the load. That is, the current being supplied may change greatly over time and the output of the voltage regulator is appropriately modified to hold the voltage constant despite wide swings in the current drawn from the regulator. The invention thereby provides, at a given node of the load, a substantially constant voltage regardless of the value of the current actually drawn by the load.

This regulator is, therefore, adapted to power the bit lines of an electrically programmable non-volatile memory by means of electric impulses. The invention provides a high current for the memory cells in order to generate appropriate charge carriers within the cells and thus enable the logic state of the cell to be changed.

It will be appreciated that the embodiments described and illustrated hereinabove may be altered and modified in many ways without departing from the scope of this invention.

We claim:

1. A circuit comprising:
   a first selection circuit for selecting electrically programmable non-volatile memory elements to be programmed, said first selection circuit being connected to a power supply line for programming a state of at least one memory element, said first selection circuit having impedance characteristics, a programming current being drawn through said first selection circuit when the memory element is selected and programmed;
   at least first and second impedance elements connected between first and second terminals of a voltage supply;
   a first circuit having impedance characteristics substantially equal to a selected ratio times the impedance characteristics of said first selection circuit when the first circuit and the first selection circuit are turned on, said first circuit being coupled serially with the impedance elements between the first and second terminals of the voltage supply;
   at least one controlled current generator connected between one of the first and second voltage supply terminals and a node linking to one of the impedance elements, and being coupled to the first selection circuit, wherein the current generated by the at least one controlled current generator is controlled to be a function of the programming current through said first selection circuit; and
   an operational amplifier having an inverting input and a non-inverting input, said non-inverting input being connected to a node linking to at least one of the impedance elements and whose output terminal is a voltage regulator output terminal to which the inverting input and said first selection circuit are coupled.

2. The circuit according to claim 1 wherein said operational amplifier is connected into a unity gain circuit configuration.

3. The circuit according to claim 1 wherein said operational amplifier includes a gain stage and a source-follower output stage.

4. The circuit according to claim 3 wherein said source-follower output stage comprises a first transistor driven by said gain stage and connected to provide a control signal to said controlled current generator.

5. The circuit according to claim 1 wherein said first circuit includes a first transistor having a control terminal which forms an input terminal of the circuit.

6. The circuit according to claim 5 wherein said first transistor is a field-effect transistor whose control terminal is the gate terminal.

7. The circuit according to claim 1, comprising:
   a second selection circuit coupled in series with said first selection circuit, said second selection circuit having impedance characteristics.

8. The circuit according to claim 7, further including a second circuit coupled in series with said first circuit, said second circuit having impedance characteristics substantially equal to a selected ratio times the impedance characteristics of said second selection circuit when the second circuit and the second selection circuit are turned on.

9. A circuit comprising:
   a programming selection circuit for selecting at least one electrically programmable non-volatile memory element to be programmed, said programming selection circuit including at least a first transistor and having a first voltage drop when turned on, said programming selection circuit being arranged for connection to a bit line of an electrically programmable non-volatile memory device;
   first and second voltage supply terminals;
   a voltage divider circuit coupled between said first and second voltage supply terminals and providing a reference voltage, said voltage divider circuit including a matched circuit having a first terminal coupled to a first node, the matched circuit having at least a second transistor, the matched circuit having a second voltage drop when said matched circuit is turned on, the second voltage drop being substantially equal to a selected ratio times the first voltage drop;
   a first controlled current generator connected between said first voltage supply terminal and the first node, said first controlled current generator being controlled by a first signal;
   an amplifier having an input terminal coupled to said voltage divider circuit to receive the reference voltage, and having an output terminal electrically connected to the programming selection circuit for providing a regulated voltage to the at least one non-volatile memory element when selected by said programming selection circuit, the memory element drawing a programming current through said programming selection circuit when the memory element is programmed; and
   a feedback loop for providing the first signal to said first controlled current generator, said feedback loop being coupled between said amplifier and said first controlled current generator, the first signal being substantially proportional to the programming current.

10. The circuit according to claim 9 wherein said first controlled current generator is a controlled current source that is controlled by the first signal.

11. The circuit according to claim 9 wherein said voltage divider circuit comprises a first impedance element and a second impedance element, said first impedance element being coupled between said first voltage supply terminal and the first node, said second impedance element being coupled between said second voltage supply terminal and a second node, the first terminal of said matched circuit and the input terminal of said amplifier being coupled to the first node and a second terminal of said matched circuit being coupled to the second node.

12. The circuit according to claim 9 wherein said voltage divider circuit comprises a first resistive element and a second resistive element, said first resistive element being coupled between said first voltage supply terminal and a second node, said second resistive element being coupled between the second node and the first terminal of said matched circuit, a second terminal of said matched circuit being coupled to said second voltage supply terminal and the input terminal of said amplifier being coupled to the second node, said voltage divider circuit providing the reference voltage at the second node.

13. The circuit according to claim 9 wherein the second voltage drop is equal to a selected ratio times the first voltage drop, and wherein said amplifier is an operational amplifier, the input terminal of said operational amplifier being a non-inverting input of said operational amplifier, and said operational amplifier being connected into a unity gain circuit configuration.

14. The circuit according to claim 13 wherein said operational amplifier includes a gain stage and a source-follower output stage.

15. The circuit according to claim 9 wherein said amplifier is an operational amplifier having a source-follower output stage that senses the output of the operational amplifier and has its source electrically connectable to the programming selection circuit.

16. The circuit according to claim 15 wherein the source-follower output stage comprises a transistor for sensing current provided by said amplifier when memory elements are selected and programmed, said transistor having a gate terminal coupled to a gain stage included in the operational amplifier and a first terminal coupled to provide the first signal to said first controlled current generator, said transistor having a second terminal electrically connectable to the programming selection circuit, and wherein the second voltage drop is equal to a selected ratio times the first voltage drop.

17. The circuit according to claim 9 wherein said amplifier is an operational amplifier.

18. The circuit according to claim 9 wherein said matched circuit includes a number of transistors equal to a number of transistors comprising the programming selection circuit.

19. The circuit according to claim 11, further comprising a second controlled current generator connected between said second node and said second voltage supply terminal, said second controlled current generator being controlled by said first signal.

20. The circuit according to claim 11, further comprising a second controlled current generator coupled between said second voltage supply terminal and the second node, said second controlled current generator being controlled by the first signal.

21. A circuit comprising:
   an array of electrically programmable memory cells;
   a plurality of bit lines coupled to said memory cells;
   first and second voltage supply terminals;
   a programming selection circuit for selecting memory cells to be programmed, said programming selection circuit being coupled to one of said bit lines, said programming selection circuit including a first transistor, said programming selection circuit having a first voltage drop when turned on;
   an amplifier having a source-follower output stage and an output terminal coupled to said programming selection circuit through the source-follower output stage, said amplifier providing an output voltage to said programming selection circuit for programming memory cells that are selected, the memory cells drawing a programming current through said selection circuit when said memory cells are programmed, the output voltage depending upon an input voltage provided to an input terminal of the amplifier;
   a voltage divider having a first circuit including a second transistor, said voltage divider being coupled between said first and second voltage supply terminals, said voltage divider being coupled to the input terminal of said amplifier at a first node to provide a reference voltage to the input terminal of said amplifier, the first circuit having a second voltage drop when turned on, the second voltage drop being substantially equal to a selected ratio times the first voltage drop of the programming selection circuit;

a controlled current generator connected between said first voltage supply terminal and the first circuit, said controlled current generator being controlled by a first signal; and a feedback loop for providing the first signal to said controlled current generator, said feedback loop being coupled between said amplifier and said controlled current generator.

22. The circuit according to claim 21 wherein the first circuit includes a number of transistors equal to a number of transistors comprising said programming selection circuit.

23. A circuit comprising:

a programming selection circuit for selecting a memory element to be programmed in an electrically programmable non-volatile memory device, said programming selection circuit including a first transistor and having a first voltage drop when turned on, said programming selection circuit being connected to a power supply line for programming a state of the memory element;

first and second voltage supply terminals;

an output terminal connected to said programming selection circuit for programming the state of the memory element through said programming selection circuit;

a voltage divider coupled between said first and second voltage supply terminals and providing a reference voltage, said voltage divider having a first circuit that is coupled to a first node at a first terminal of said first circuit, said first circuit having a second voltage drop when said first circuit is turned on, the second voltage drop being substantially equal to a selected ratio times the first voltage drop;

a first controlled current generator connected between said first voltage supply terminal and the first node, said first controlled current generator being controlled by a first signal;

an amplifier having an input terminal coupled to said voltage divider to receive the reference voltage and having an output stage coupled to said output terminal for providing a regulated voltage to the memory element when selected by said programming selection circuit, the memory element drawing a programming current through said programming selection circuit when the memory element is programmed, said output stage sensing the programming current; and a feedback loop coupled between said output stage and said first controlled current generator to provide the first signal to control said first controlled current generator, such that said first controlled current generator continuously adjusts current injected to the first node according to the programming current drawn.

24. The circuit according to claim 23 wherein said voltage divider comprises:

a first impedance element coupled between said first voltage supply terminal and the first node; and a second impedance element coupled between said second voltage supply terminal and a second terminal of said first circuit.

25. The circuit according to claim 23 wherein said voltage divider comprises:

a first resistive element coupled between said first voltage supply terminal and a second node; and a second resistive element coupled between the second node and a first terminal of said first circuit at the first node, a second terminal of said first circuit being coupled to said second voltage supply terminal.

26. The circuit according to claim 24, further comprising a second controlled current generator connected between said second terminal and said second voltage supply terminal, said second controlled current generator being controlled by said first signal, wherein said second controlled current generator draws the current injected by said first controlled current generator.

27. A circuit comprising:

a programming selection circuit for selecting at least one electrically programmable non-volatile memory element to be programmed, said programming selection circuit including at least a first transistor and having a first voltage drop when turned on, said programming selection circuit being arranged for connection to a bit line of an electrically programmable non-volatile memory device;

first and second voltage supply terminals;

a voltage divider circuit coupled between said first and second voltage supply terminals and providing a reference voltage, said voltage divider circuit including a matched circuit having a first terminal coupled to a first node, the matched circuit having at least a second transistor, the matched circuit having a second voltage drop when said matched circuit is turned on,, the second voltage drop being substantially equal to a selected ratio times the first voltage drop;

a first controlled current generator connected between said first voltage supply terminal and the first node, said first controlled current generator being controlled by a first signal, whereby said first controlled current generator drives current through said matched circuit to induce said second voltage drop across said matched circuit;

an amplifier having an input terminal coupled to said voltage divider circuit to receive the reference voltage, and an output terminal electrically connected to the programming selection circuit for providing a regulated voltage to the at least one non-volatile memory element when selected by said programming selection circuit, the memory element drawing a programming current through said programming selection circuit when the memory element is programmed; and a feedback loop for providing the first signal to said first controlled current generator, said feedback loop being coupled between said amplifier and said first controlled current generator, the first signal being substantially proportional to the programming current.

28. A circuit comprising:

an array of electrically programmable memory cells;

a plurality of bit lines coupled to said memory cells;

first and second voltage supply terminals;

a programming selection circuit for selecting memory cells to be programmed, said programming selection circuit being coupled to one of said bit lines, said programming selection circuit including a first transistor, said programming selection circuit having a first voltage drop when turned on;

an amplifier having a source-follower output stage and an output terminal coupled to said programming selection circuit through the source-follower output stage, said amplifier providing an output voltage to said programming selection circuit for programming memory cells that are selected, the memory cells drawing a programming current through said selection circuit when said memory cells are programmed, the output voltage depending upon an input voltage provided to an input terminal of the amplifier;

a voltage divider having a first circuit including a second transistor, said voltage divider being coupled between said first and second voltage supply terminals, said voltage divider being coupled to the input terminal of said amplifier at a first node to provide a reference voltage to the input terminal of said amplifier, the first circuit having a second voltage drop when turned on, the second voltage drop being substantially equal to a selected ratio times the first voltage drop of the programming selection circuit;

a controlled current generator connected between said first voltage supply terminal and the first circuit, said controlled current generator being controlled by a first signal, whereby said controlled current generator drives current through said first circuit to induce said second voltage drop across said first circuit; and a feedback loop for providing the first signal to said controlled current generator, said feedback loop being coupled between said amplifier and said controlled current generator.

* * * * *